(12) United States Patent
Ku

(10) Patent No.: US 7,845,828 B2
(45) Date of Patent: Dec. 7, 2010

(54) LED ASSEMBLY INCORPORATING A STRUCTURE FOR PREVENTING SOLDER CONTAMINATION WHEN SOLDERING ELECTRODE LEADS THEREOF TOGETHER

(75) Inventor: Chin-Long Ku, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 372 days.

(21) Appl. No.: 12/115,515

(22) Filed: May 5, 2008

(65) Prior Publication Data
US 2009/0236617 A1    Sep. 24, 2009

(30) Foreign Application Priority Data
Mar. 19, 2008    (CN) .................. 2008 1 0066130

(51) Int. Cl.
*F21V 21/00* (2006.01)
(52) U.S. Cl. .............. 362/249.02; 362/249.14; 257/98
(58) Field of Classification Search ............ 362/249.14, 362/249.02–249.06, 230, 231, 800, 612, 362/555, 545, 97.3; 257/98–100
See application file for complete search history.

(56) References Cited

U.S. PATENT DOCUMENTS

| | | | |
|---|---|---|---|
| 6,682,205 B2* | 1/2004 | Lin | 362/555 |
| 6,866,398 B2* | 3/2005 | Lin | 362/249.04 |
| 7,152,999 B2* | 12/2006 | Lin | 362/249.06 |
| 7,594,748 B2* | 9/2009 | Chang et al. | 362/650 |
| 2003/0193803 A1* | 10/2003 | Lin | 362/250 |
| 2004/0252503 A1* | 12/2004 | Lin | 362/249 |

FOREIGN PATENT DOCUMENTS

| | | |
|---|---|---|
| CN | 1117257 A | 2/1996 |
| CN | 2809879 Y | 8/2006 |
| CN | 2851821 Y | 12/2006 |

* cited by examiner

Primary Examiner—Bao Q Truong
(74) Attorney, Agent, or Firm—Frank R. Niranjan

(57) ABSTRACT

An LED assembly includes a substrate and a plurality of LEDs mounted on the substrate. Each LED includes a base and a first and a second electrode leads inserted in the base. The first lead forms a groove in an end thereof, and the second lead forms a tab from an end thereof. The tab of each LED is received in the groove of an adjacent LED to thereby cooperatively define an accommodating space in the groove and above the tab. The accommodating space is used for receiving excess solder when soldering the first and the second leads together.

12 Claims, 24 Drawing Sheets

LED ASSEMBLY INCORPORATING A STRUCTURE FOR PREVENTING SOLDER CONTAMINATION WHEN SOLDERING ELECTRODE LEADS THEREOF TOGETHER

BACKGROUND OF THE INVENTION

1. Field of the Invention

The present invention relates to a light emitting diode (LED) assembly, and more particularly to an LED assembly incorporating a structure to prevent solder contamination when soldering electrode leads of the LEDs thereof together.

2. Description of Related Art

LED have been available since the early 1960's. Because of the relatively high efficiency of LEDs, nowadays LED usage has been increased in popularity in a variety of applications, e.g., residential, traffic, commercial, industrial settings. However, when the LED is in operation, it generates a great deal of heat, which may result in the LED overheating or even malfunction if the heat cannot be dissipated timely. Therefore, so many attempts are tried in order to effectively cool the LED.

Typically, an LED assembly comprises a metal substrate and an LED mounted on the substrate. The metal substrate sequentially forms an electrically insulated circuit layer and an electrically conducting layer thereon. A plurality of vias is defined through the electrically insulated circuit layer and the electrically conducting layer to divide them into separated parts. The LED is mounted on the substrate with a base thereof adhesively attached on an exposed surface of the substrate, and two electrode leads thereof respectively secured to separated, electrically conducting pads by soldering.

In order to achieve a sufficient light output from the LED assembly, lots of LEDs are crowdedly mounted on the substrate, which renders adjacent LEDs quite close to each other. Accordingly, the separated, electrically conducting pad should be designed to be located adjacent the LEDs as close as possible for ensuring compact arrangement of the LEDs. Nevertheless, when soldering the electrode leads of the LEDs on the separated, electrically conducting pads, the quantity of solder should be controlled in an exact range, since a gap between the adjacent, separated electrically conducting pads is so small that even a little overflowing excess solder could fill it and cause the adjacent, separated electrically conducting pads to connect with each other, resulting in a short circuit. In addition, such overflowing excess solder can contaminate other part of the LED assembly.

What is needed, therefore, is an LED assembly which can overcome the above-mentioned disadvantages.

SUMMARY OF THE INVENTION

An LED assembly includes a substrate and a plurality of LEDs mounted on the substrate. Each LED includes a base and a first and a second electrode leads fixed in the base. The first lead forms a groove in an end thereof, and the second lead forms a tab at an end thereof. The tab of each LED is received in the groove of an adjacent LED. An accommodating space is defined in the groove above the tab. The accommodating space is used for receiving excess solder when soldering the first and the second leads with each other. Therefore, lots of problems caused by excess solder overflowing of the conventional LED assembly, such as short circuit and contamination, are avoided.

Other advantages and novel features of the present invention will become more apparent from the following detailed description when taken in conjunction with the accompanying drawings, in which:

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
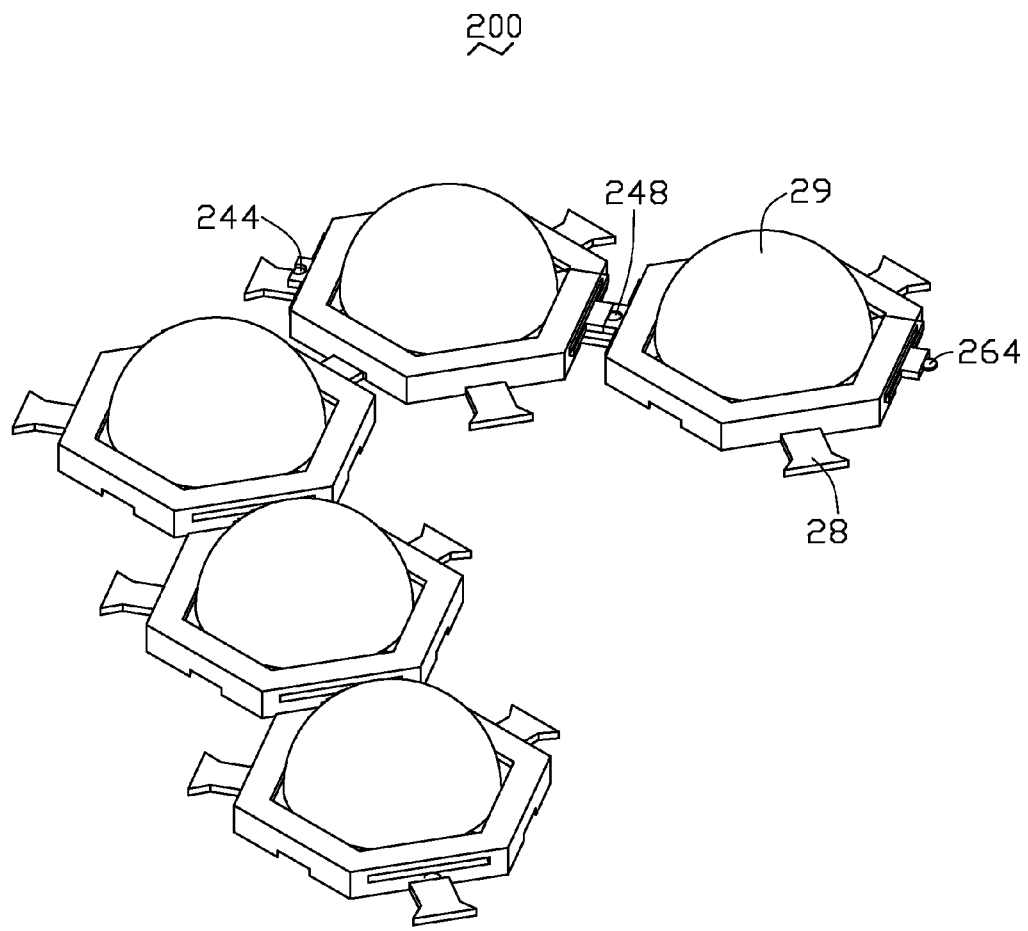
FIG. 1 is an assembled, isometric view of an LED unit of an LED assembly in accordance with a first embodiment of the present invention.
Figure 2:
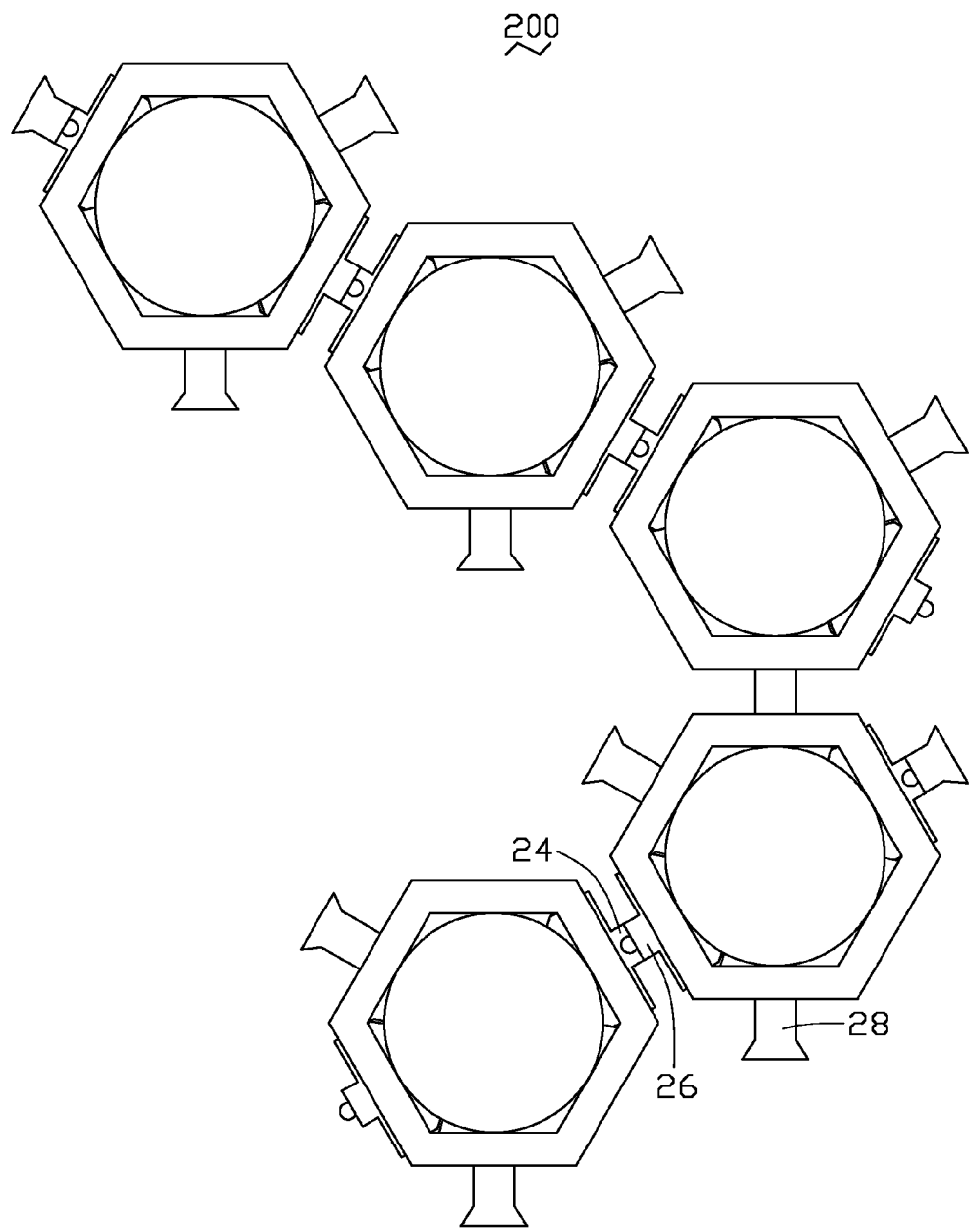
FIG. 2 is a top view of FIG. 1.
Figure 3:
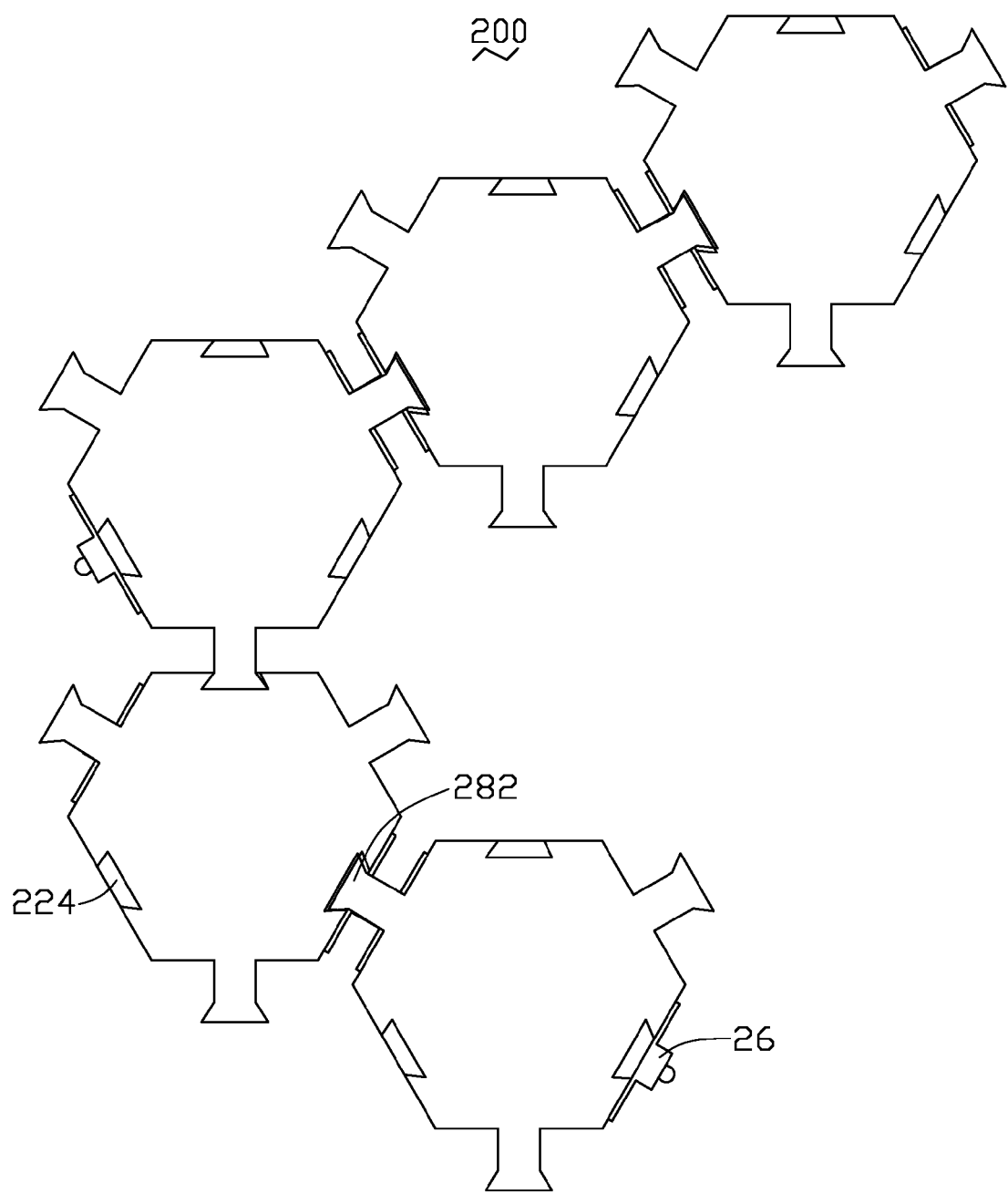
FIG. 3 is a bottom view of FIG. 1.
Figure 4:
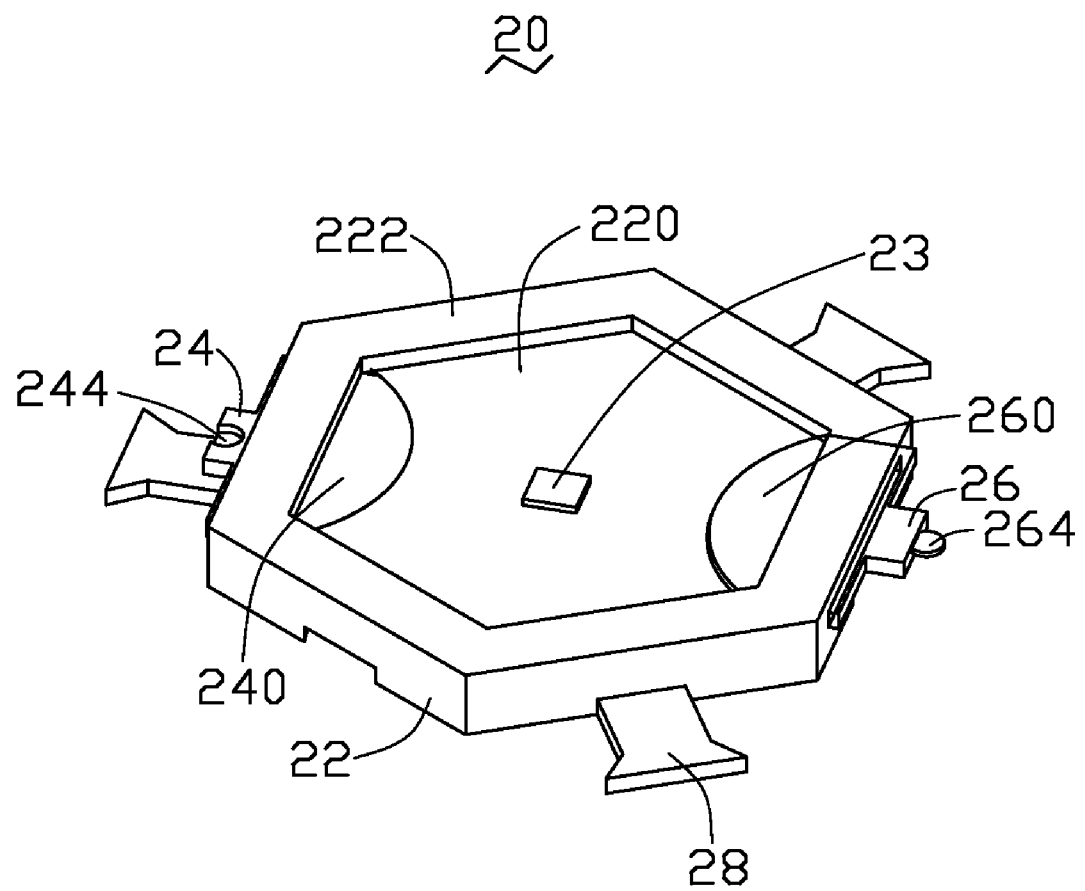
FIG. 4 is an enlarged, perspective view of an LED of the LED unit of FIG. 1, wherein an encapsulant of the LED is removed for clarity.
Figure 5:
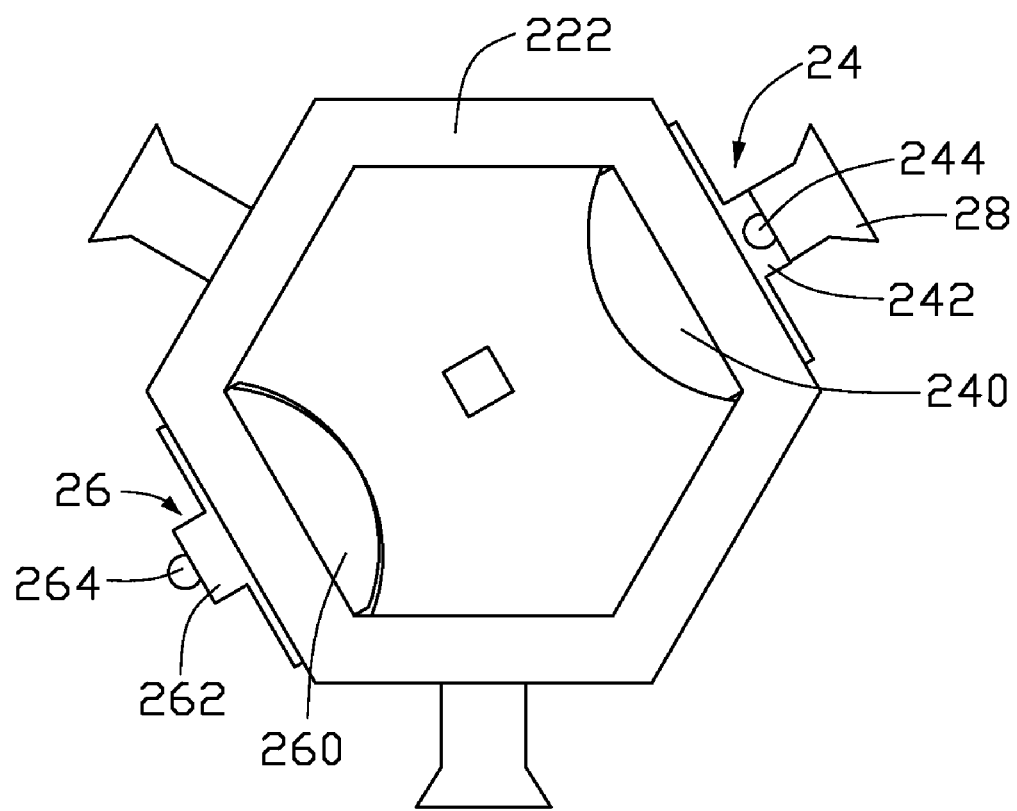
FIG. 5 is a top view of FIG. 4.
Figure 6:
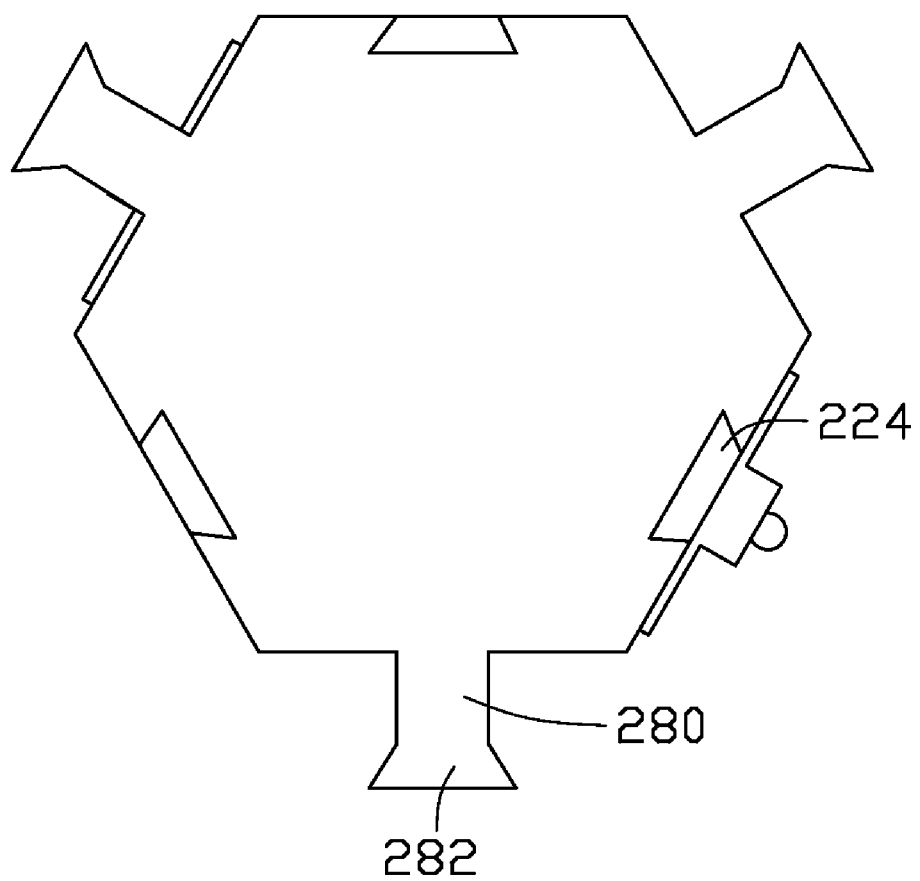
FIG. 6 is a bottom view of FIG. 4.
Figure 7:
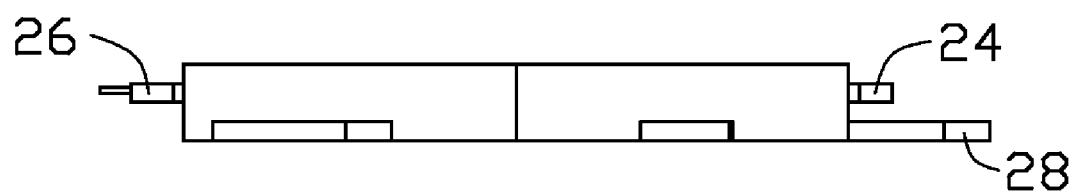
FIG. 7 is a side view of FIG. 4.
Figure 8:
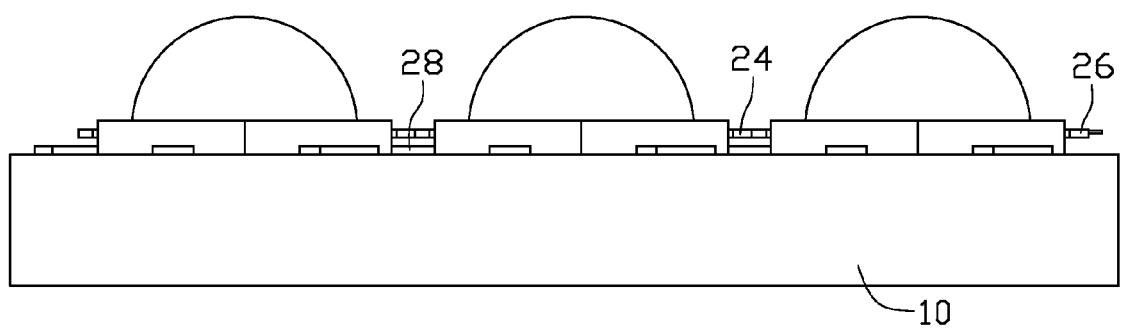
FIG. 8 is a side view of FIG. 1 with a substrate of the LED assembly placed below the LED unit.

Referring to FIGS. 1 and 8, an LED assembly in accordance with a first embodiment of the present invention comprises a substrate 10 and an LED unit 200 mounted on the substrate 10.

The substrate 10 is solid and entirely made of metal, such as copper, aluminum or an alloy thereof. The substrate 10 has a large and flat top surface for mounting the LED unit 200 thereon.

Also referring to FIGS. 4-7, the LED unit 200 is constructed by soldering a plurality of LEDs 20 together. Each LED 20 comprises a hexagonal base 22 defining a hexagonal cavity 220 therein, an LED die 23 adhesively attached in the cavity 220, a first electrode lead 24 and a second electrode lead 26 extending into the base 22 and electrically coupled to the LED die 23 via bonding wires (not shown), three legs 28 extending radially and outwardly from the base 22, and a hemispherical encapsulant 29 (see FIG. 1) encapsulating the LED die 23 therein. The base 22 is made of a material having a good heat conducting and electrically insulating capability, which is well known by those skilled in the related art, such as ceramic. The base 22 is in direct thermal contact with the top surface of the substrate 10 to direct heat generated by the LED die 23 to the substrate 10. The cavity 220 is defined in a central area of a top face of the base 22, being concentric with the base 22. A hexagonal ring-shaped step 222 is formed between the cavity 220 and a circumferential periphery of the base 22. The cavity 220 is used for receiving the LED die 23 therein, and retaining a bottom of the encapsulant 29 as well.

The first and second leads 24, 26 are substantially planar and parallel to the substrate 10; they are extended into the base 22 from two opposite sides of the base 22. Each of the first and second leads 24, 26 comprises a sheet 240, 260 penetrating through the step 222 to be located in the cavity 220, and a block 242, 262 (illustrated in FIG. 5) extending outwardly and horizontally from an extremity end of the sheet 240, 260 to be located outside of a corresponding side of the base 22. The first and second leads 24, 26 are located above the substrate 10 when the LED 20 is mounted on the substrate 10 (see FIG. 8). Each sheet 240, 260 consists of an arced inner part (not labeled) at the bottom of the cavity 220 for electrically connecting to the LED die 23 via the bonding wires, a middle part (not shown) fixedly received in the step 222 to secure the first and second leads 24, 26 in position, and a rectangular outer part (not labeled) extending beyond the step 222 to couple with the block 242, 262. An area of each sheet 240, 260 is far larger than that of each block 242, 262, to thereby enhance a reliability of the electrical connection of the first and second leads 24, 26 with the bonding wires. The block 242 of the first lead 24 forms an approximately circular groove 244 on a top face thereof, while the block 262 of the second lead 26 forms a nearly circular tab 264 projecting outwardly and horizontally from an extremity end thereof. As viewed from FIG. 1, the plurality of LEDs 20 are so electrically connected together that the grooves 244 of the first leads 24 of the LEDs 20 fittingly accommodate the tabs 264 of the second leads 26 of adjacent LEDs 20 therein. Since a current supplied to the LED die 23 travels through the first and second leads 24, 26 hovering above the substrate 10, wherein the substrate 10 is responsible for dissipating heat generated by the LED die 23 from the base 22, a current transferring pathway of the LED assembly is separated from a heat conducting pathway by a clearance between the substrate 10 and the first and second leads 24, 26; thus, an effect of the heat generated by the LED die 23 in influencing the current supplied to the LED die 23 can be reduced to an acceptable range. A depth of the groove 244 of the first lead 24 is slightly larger than a thickness of the tab 264 of the second lead 26, whereby when the tab 264 is retained into the groove 244, an accommodating space 248 is formed between a top of the tab 264 and a lateral of the groove 244 (shown in FIG. 1). In other words, the space 248 is defined by a portion of the groove 244 which is positioned above the tab 264. During soldering of the first and second leads 24, 26 together, the space 248 is capable of receiving excess solder (not shown) therein to prevent the excess solder from overflowing to the substrate 10.

The encapsulant 29 is partially retained into the cavity 220, and projects upwardly in a manner that a size of a cross-section thereof gradually decreases from bottom toward top. The encapsulant 29 envelops the LED die 23 and the inner parts of the sheets 240, 260 of the first and second leads 24, 26 therein, to protect the inner parts of the sheets 240, 260 and the LED die 23 from external influence, e.g., contamination and humidity. The encapsulant 29 is made of a transparent material, such as epoxy, glass, silicone or the like, to guide light emitted by the LED die 23 to radiate out of the LED 20. A fluorescent material (not shown) which is in particulate form, can be dotted in the encapsulant 29, to help the LED 20 to exhibit a certain colorful characteristic, when it is desired.

The three legs 28 are uniformly distributed around the circumferential periphery of the base 22 and located in vicinities of a bottom face of the base 22. The legs 28 are spaced from the first and second leads 24, 26 to avoid direct thermal contact therebetween. Each leg 28 is formed integrally with the base 22 and comprises a rectangular strip 280 and a trapezoidal locking portion 282 extending horizontally and outwardly from the strip 280 (see FIG. 6). Three cutouts 224 are equidistantly designed in the bottom face of the base 22 to alternate with the three legs 28, wherein each cutout 224 is trapezoidal in shape so as to receive the locking portion 282 of a corresponding leg 28 therein, thus engagingly securing adjacent LEDs 20 with each other.

In assembly, the LEDs 20 are fixed to each other to form the LED unit 200; the locking portion 282 of each leg 28 of each LED 20 is accommodated into a corresponding cutout 244 of an adjacent LED 20, and the tab 264 of the second lead 26 of each LED 20 is received in the groove 244 of the first lead 24 of the adjacent LED 20. Then the locking portions 282 of the legs 28 are soldered in the cutouts 224 of the bases 22, whereby the LED unit 200 is securely formed. The LED unit 200 is attached on the substrate 10 to cooperatively construct the LED assembly. At last, the first and second leads 24, 26 are soldered together to electrically connect the plurality of LEDs 20.

With the help of the space 248, during soldering of the first and second leads 24, 26, even if a quantity of the solder offered to the first and second leads 24, 26 exceeds a predetermined amount, the excess portion of the solder would not overflow to contaminate the LED assembly, particularly, the substrate 10. Thus, the top surface of the substrate 10 which supports the LEDs 20 thereon can be kept clean, and the problem caused by the overflowed solder such as a short circuit can be avoided.

In use, when the LED die 23 is activated to lighten, the heat generated by the LED die 23 is conducted to the substrate 10 via the base 22, while the current is conveyed to the LED die 23 through the first and second leads 24, 26. Since the first and second leads 24, 26 are separated from the substrate 10, the pathway through which the current is supplied is separated from the pathway through which the heat is dissipated, the heat would not significantly affect the set value of the current supplied to the LED die 23; thus, the current is capable of being maintained in a relatively steady level. The steadily input current insures the LED die 23 emitting light with a constant intensity; a good illumination of the LED assembly is thus obtained, and a lifetime of the LED assembly is accordingly prolonged.

Alternatively, during assembling, the process of soldering the first and second leads 24, 26 together can be implemented before the LED unit 200 attached on the substrate 10; thus, the LED unit 200 is substantially completed prior to the LED assembly. Since the LED unit 200 has the first and second leads 24, 26 connected with each other to realize electrical connections, and the legs 28 locked with the bases 22 to realize mechanical connections; thus, if the bases 22 of the LED unit 200 can provide sufficient heat dissipation to the LED dies 23, no substrate 10 is needed, and the LED unit 200 can be utilized individually. The LEDs 20 of the individual LED unit 200 can be freely arranged in various patterns according to different demands, without being restricted by a shape or a size of the substrate 10; therefore, a versatility of the LED unit 200 is obtained.

Furthermore, the relationship and the number of the first and second leads 24, 26 and the legs 28 can be changed in accordance with different requirements. For example, the first lead 24 can be located adjacent to the second lead 26, and one of the three legs 28 can be removed for reducing a manufacture cost.

Figure 9:
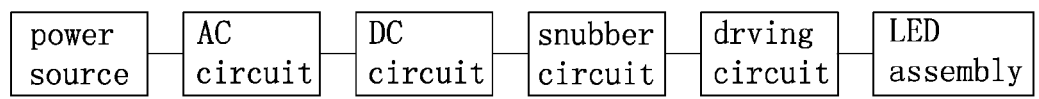
FIG. 9 is a schematic block view of a power supply circuit connected between a power source and the LED assembly, wherein a snubber circuit is connected between a DC circuit and a driving circuit of the power supply circuit.
Figure 10:
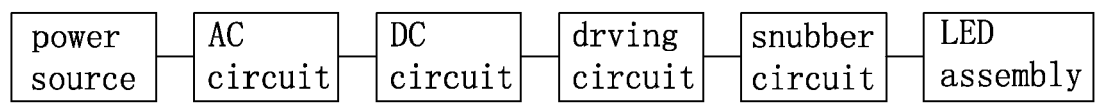
FIG. 10 is a view similar to FIG. 9, but the snubber circuit is positioned between the driving circuit and the LED assembly.

As illustrated in FIG. 9, the LED assembly can be connected to a snubber circuit to protect the LED die 23 from being damaged at the time when initially, electrically connecting the LED assembly to a power source. Conventionally, the LED assembly is sequentially connected to a driving circuit, a direct current (hereinafter is predigested to DC) circuit, an alternating current (hereinafter is predigested to AC) circuit, and a power source (such driving circuit, DC circuit and AC circuit are cooperatively called a power supply circuit). The AC circuit inputs an AC into DC circuit from the power source, the DC circuit converts the AC to a DC, which is then conveyed to the LED assembly via the driving circuit. However, such power supply circuit can only control a current type and a current value, and cannot control a varied range of the current. Following a suddenly, electrically connecting action, the current varies dramatically from zero to a large value in a relatively short time, which input into the LED die 23 from the circuit supply circuit would damage the LED die 23. Therefore, in FIG. 9 of the present invention, the snubber circuit is added between the DC circuit and the driving circuit, to relieve the sharply varied current to a gradually increased current, which smoothly input into the LED assembly would not damage the LED die 23. In operation, as soon as the LED assembly electrically connected, a sharply varied AC is produced and is conveyed to the DC circuit via the AC circuit. The DC circuit converts the sharply varied AC into a sharply varied DC, which is input into the snubber circuit. After passing through the snubber circuit, the sharp variation of the DC is relieved, and the DC becomes gradually increased. The gradually increased DC is then input into the LED assembly via the driving circuit, and enables the LED die 23 to lighten from dark to bright slowly. Therefore, the damage caused by the current to the LED die 23 is prevented. Also, it can be apprehended by those skilled in the related art that such snubber circuit can be connected between the driving circuit and the DC circuit as well, which is shown in FIG. 10.

Figure 11:
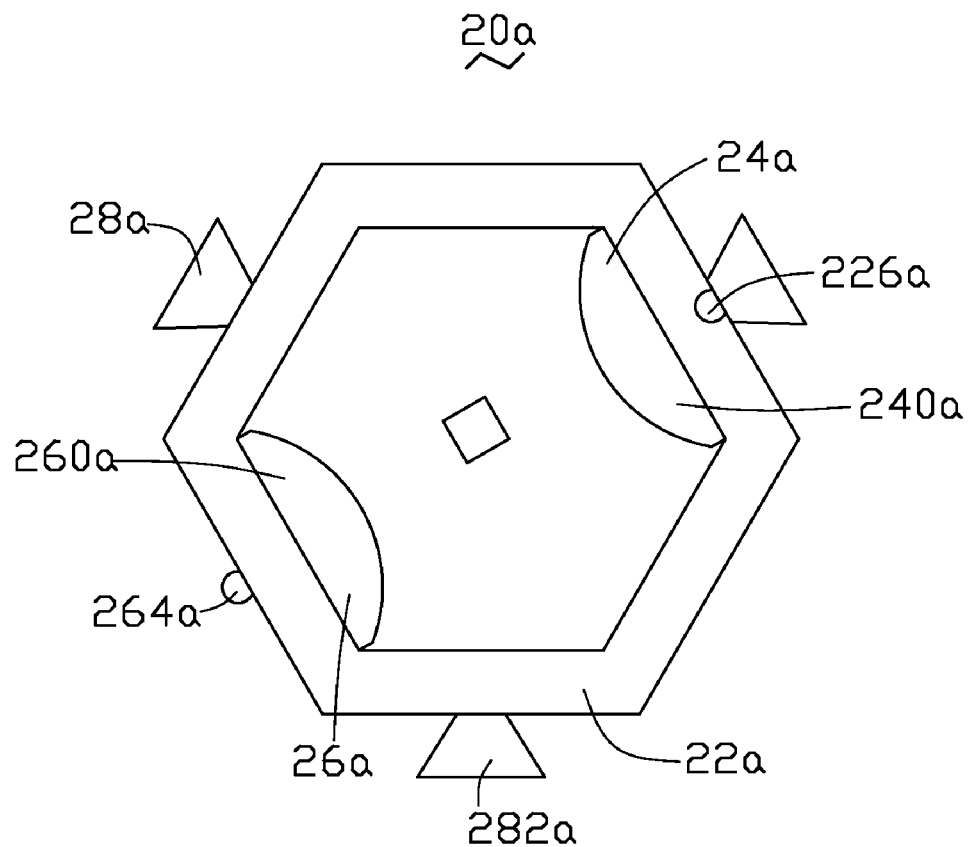
FIG. 11 is a view similar to FIG. 5, showing an LED in accordance with a second embodiment of the present invention, wherein a first lead, a second lead and legs of the LED are shorter than those of the LED of FIG. 5.

A distance between two adjacent LEDs 20 is associated with a length of the strip 280 of the leg 28 and a sum of lengths of respective portions of the first lead 24 and the second lead 26 extending outside the base 22. In order to obtain much more light per area, the LEDs 20 should abut against each other more intimately without the distance existing therebetween, or only a little distance therebetween. FIG. 11 schematically shows a second embodiment of the present invention, in which the configurations of the first and second leads 24a, 26a and the legs 28a are changed so as to hold adjacent LEDs 20a in intimate contact with each other. The first lead 24a of the LED 20a comprises a sheet 240a entirely received in a base 22a. The second lead 26a comprises a sheet 260a accommodated within the base 22a, and a tab 264a extending outwardly beyond the base 22a. For realizing a connection between the first lead 24a and the second lead 26a of two adjacent LEDs 20a, a portion of the base 22a is recessed to form a trough 226a, in which an outmost part of the sheet 240a of the first lead 24a is exposed. Accordingly, each leg 28a only remains a locking portion 282a to be snugly fitted into a corresponding cutout (not shown) in an adjacent base 22a. Since the tab 264a of the second lead 26a of each LED 20a is fully received in the trough 226a of the base 22a of an adjacent LED 20a to electrically connect with the first lead 24a of the adjacent LED 20a, and the leg 28a completely received in the corresponding cutout of the base 22 of the adjacent LED 20a, lateral sides of the two adjacent LEDs 20a are capable of abutting against each other intimately. Thus, LEDs 20a can be arranged in a higher density, and an overall output intensity of the light is accordingly increased. On the other hand, supposed that the light produced per area can meet a lighting intensity requirement, the first and second leads 24, 26 and the legs 28 of the LEDs 20 of the first embodiment only need to be shorten, to avoid redesigning and remanufacturing of the base 22.

Figure 12:
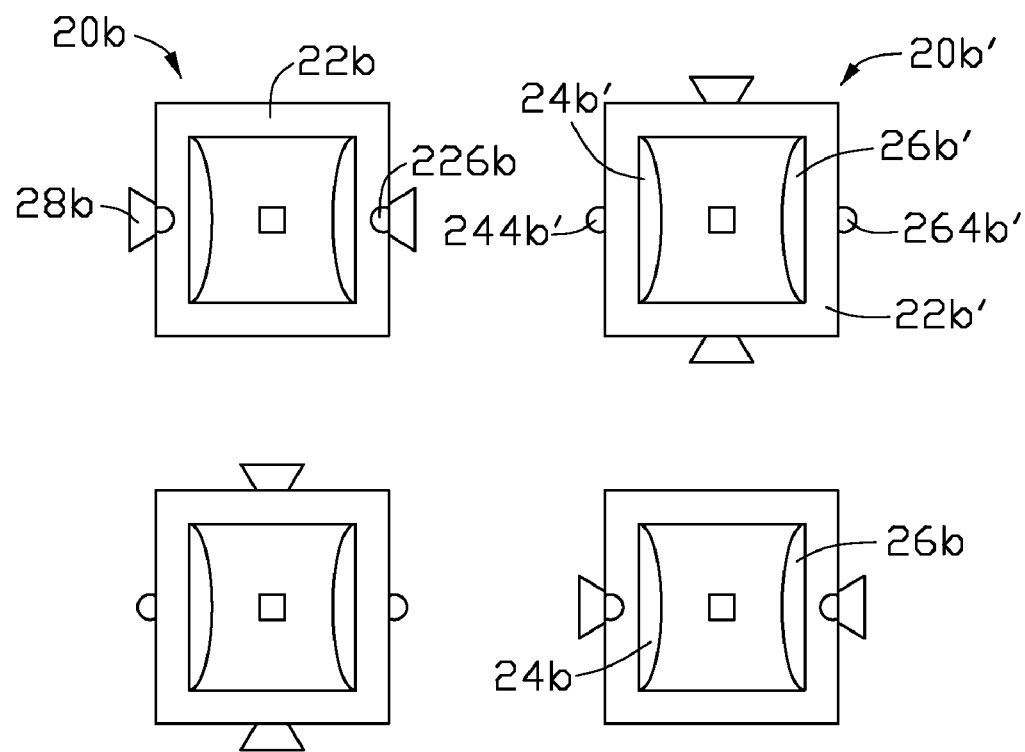
FIG. 12 is a top view of an LED unit in accordance with a third embodiment of the present invention.
Figure 13:
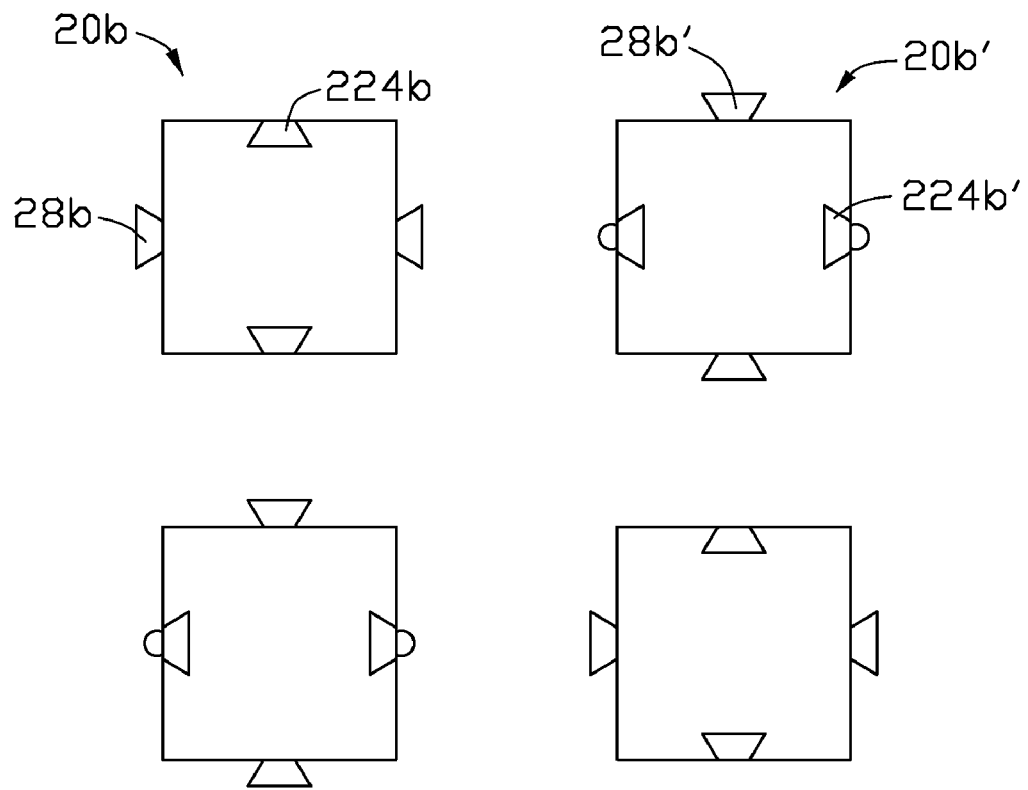
FIG. 13 is a bottom view of FIG. 12.
Figure 14:
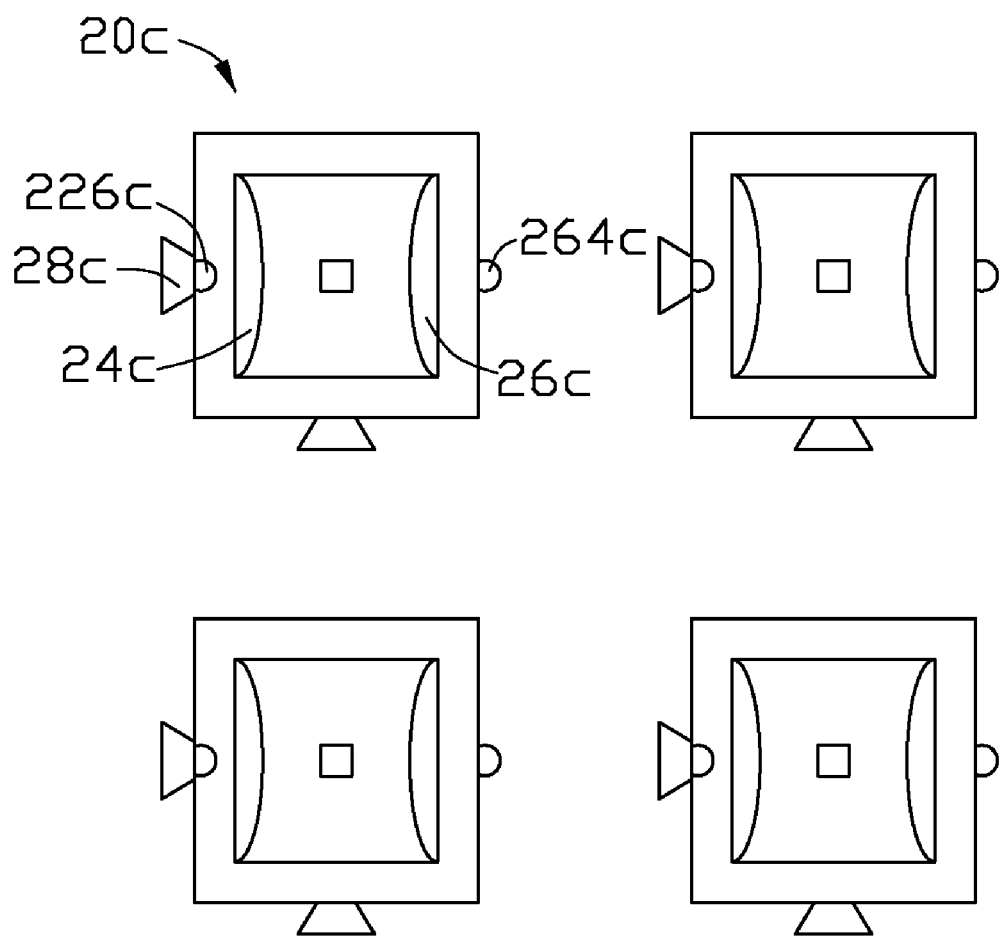
FIG. 14 is a top view of an LED unit in accordance with a forth embodiment of the present invention.
Figure 15:
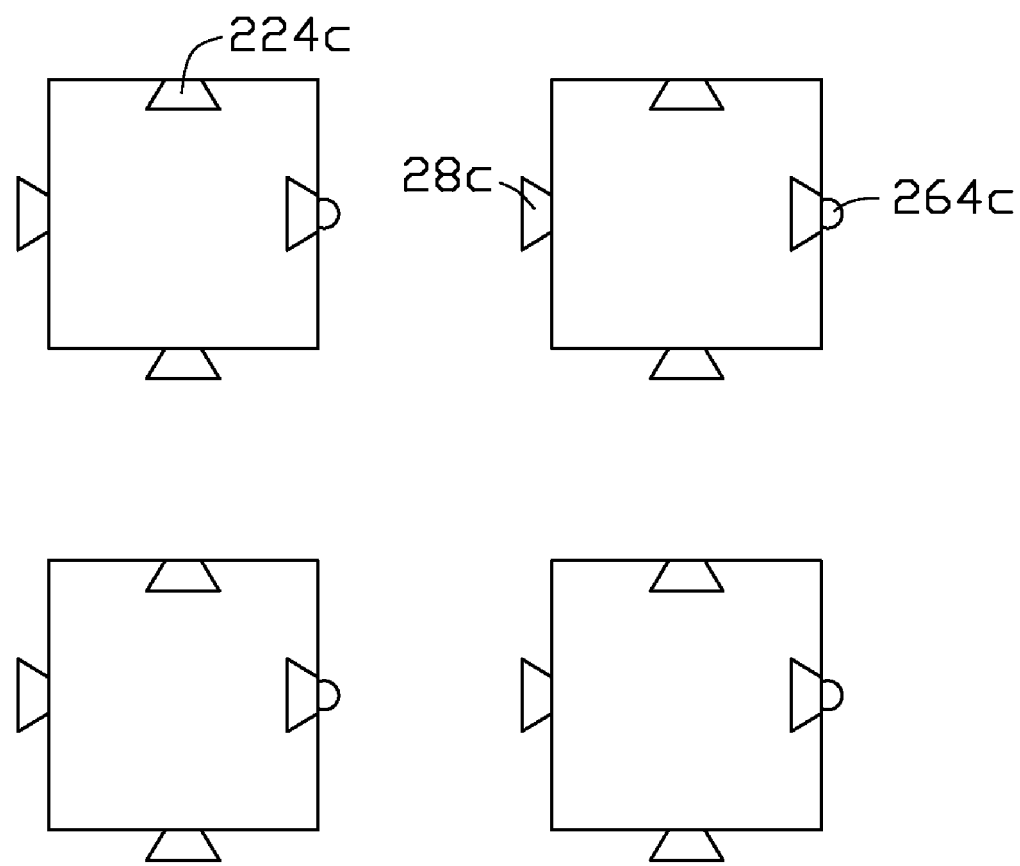
FIG. 15 is a bottom view of FIG. 14.

Note that a shape and a size of the base 20 of the first embodiment can be changed to various types according to different occasions. For example, FIGS. 12-13 illustrate a third embodiment of the present invention, in which the base 22b, 22b' is in the form of a square, and has two legs 28b, 28b' formed from two opposite sides thereof and two cutouts 224b, 224b' defined at other two opposite sides thereof. In this embodiment there are two types of LEDs 20b, 20b': the first type LEDs 20b each have two troughs 226b defined at the two opposite sides of the base 22b to expose outermost parts of a first and second leads 24b, 26b; the second type LEDs 20b' each have two opposite tabs 244b', 246b' projecting outwardly from the first and second leads 24b', 26b' beyond the other two opposite sides of the base 22b'. The tabs 244b', 264b' of the second type LED 20b' are received in the troughs 226b of an adjacent first type LED 20b and contact the first and second leads 24b, 26b of the first type LED 20b, to thereby electrically connect the first type and second type LEDs 20b, 20b' together. The first type LEDs 20b and the second type LEDs 20b' are so locked together that the legs 28b of each first type LED 20b are retained into the cutouts 224b' of two adjacent second type LEDs 20b', and the cutouts 224b of each first type LED 20b receive the legs 28b' of other two adjacent second type LEDs 20b' therein. Such mutual connections of the plurality of LEDs 20b, 20b' can also be characterized in that: the legs 28b of the first type LEDs 20b realize transverse connections, and the legs 28b' of the second type LEDs 20b' realize longitudinal connections. Furthermore, the LEDs 20b, 20b' with square bases 22b, 22b' can also be modified to have different configurations, which are illustrated in FIGS. 14-15 of the forth embodiment of the present invention, for facilitating a uniform design and manufacture of the LEDs 20b, 20b'. As shown in FIGS. 14-15, each LED 20c of the forth embodiment has two legs 28c formed from two adjacent sides of the base 22c, and two cutouts 224c defined at other two adjacent sides of the base 22c. Each LED 20c further forms a tab 264c of a second lead 26c extending outwardly beyond a side of the base 20c, and a trough 226c defined at an opposite side of the base 22c to expose an outmost part of a first lead 24c. The trough 226c receives the tab 264c of an adjacent LED 20c. In assembly, the LEDs 20c mechanically engage with each other by fitting the legs 28c of each LED 20c into corresponding cutouts 224c of two adjacent LEDs 20c, and electrically couple with each other by soldering the tab 264c of each LED 20c in the trough 226c of an adjacent LED 20c. Due to the legs 28c of each LED 20c, both transverse and longitudinal connections of the LEDs 20c can be realized, meanwhile the LEDs 20c have the same configuration and structure.

Figure 16:
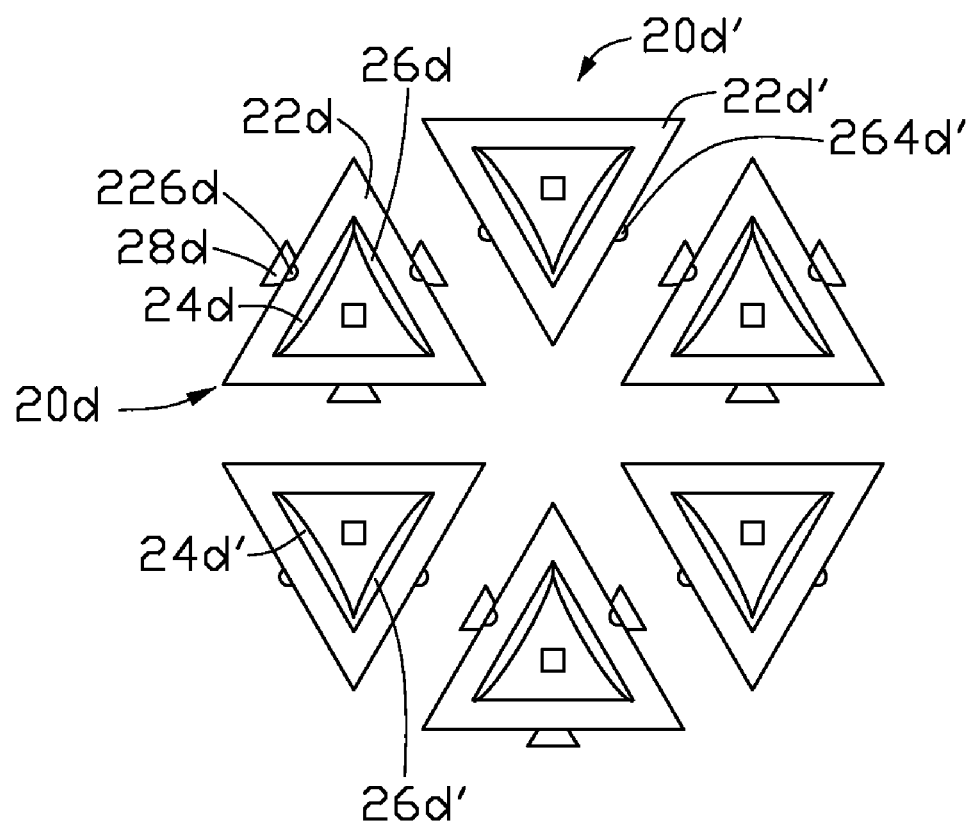
FIG. 16 is a top view of an LED unit in accordance with a fifth embodiment of the present invention.
Figure 17:
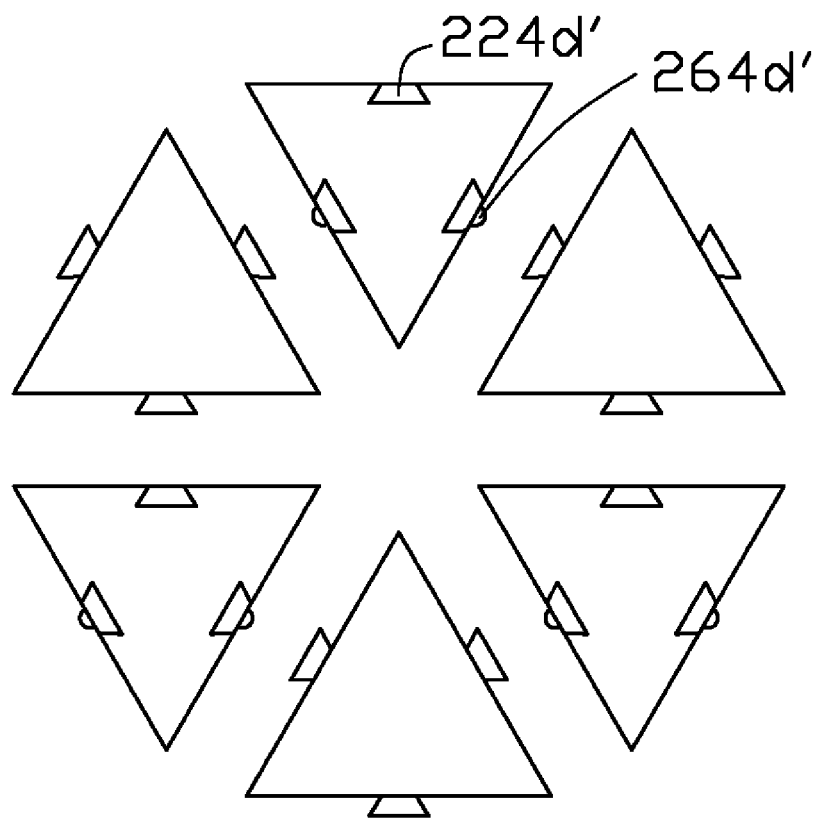
FIG. 17 is a bottom view of FIG. 16.
Figure 18:
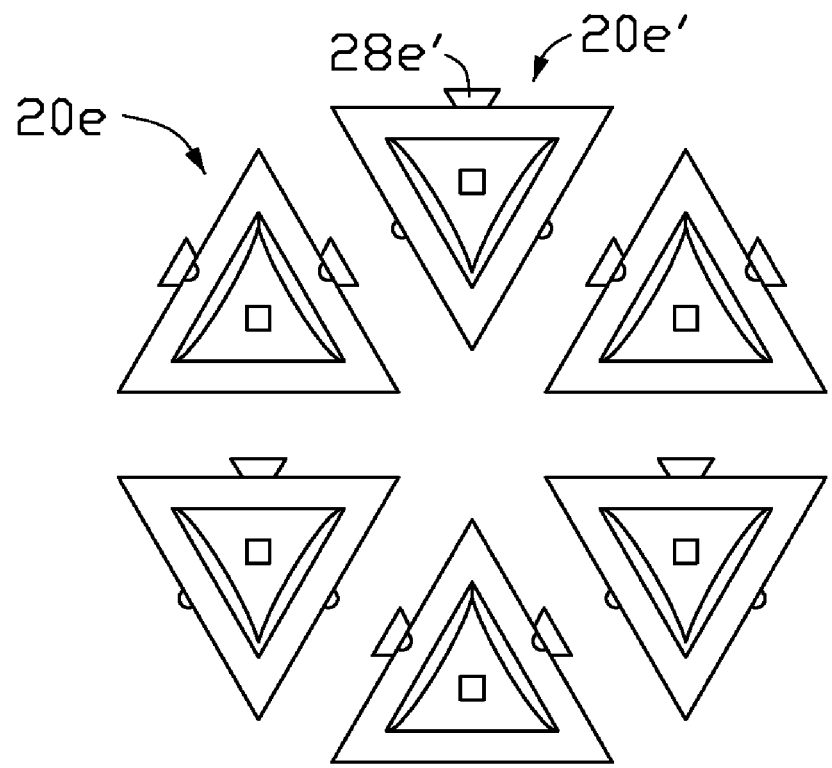
FIG. 18 is a top view of an LED unit in accordance with a sixth embodiment of the present invention.
Figure 19:
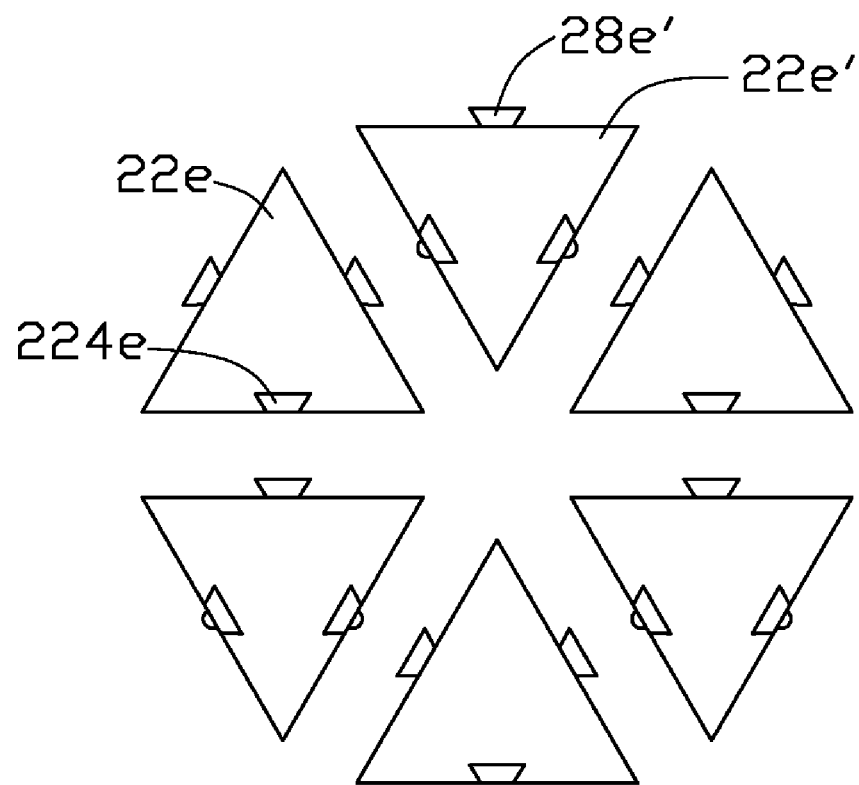
FIG. 19 is a bottom view of FIG. 18.

FIGS. 16-17 show a fifth embodiment of the present invention, in which the base 22d, 22d' is shaped to be triangle. Considering electrical and mechanical connections between the plurality of LEDs 20d, 20d', the LEDs 20d, 20d' should be designed to have two different configurations: a first type LEDs 20d each form three legs 28d respectively extending outwardly from three sides of the base 22d, and define two troughs 226d at two sides of the base 22d to expose outmost parts of a first lead 24d and a second lead 26d thereof; a second type LEDs 20d' each define three cutouts 224d' around a periphery of the base 22d' corresponding to the three legs 28d, and have two tabs 264d' extending outwardly from first and second leads 24d', 26d' beyond two sides of the base 22d'. In assembly, the three legs 28d of each first type LED 20d are respectively engaged in corresponding three cutouts 224d' of three adjacent second type LEDs 20d', and the two troughs 226d respectively accommodate two corresponding tabs 264d' of two adjacent second type LEDs 20d' therein. In this embodiment, the first type LED 20d acts as an active mechanical connector, and the second type LED 20d' is employed as a passive mechanical connector. Alternatively, one leg 28d of the first type LED 20d can be moved to the second type LED 20d', whereby each of the first type LED 20d and the second type LED 20d' acts as the active mechanical connector. Such variations of the legs 28d, 28d' between the first type LED 20d and the second type LED 20d' are shown in FIGS. 18-19 in accordance with a sixth embodiment of the present invention. A first type LED 20e forms a cutout 224e in a bottom of a base 22e at a location where the original leg 28d of the fifth embodiment is formed. Accordingly, a second type LED 20e' forms a leg 28e' at a location where the original cutout 224d' of the fifth embodiment is defined.

Figure 20:
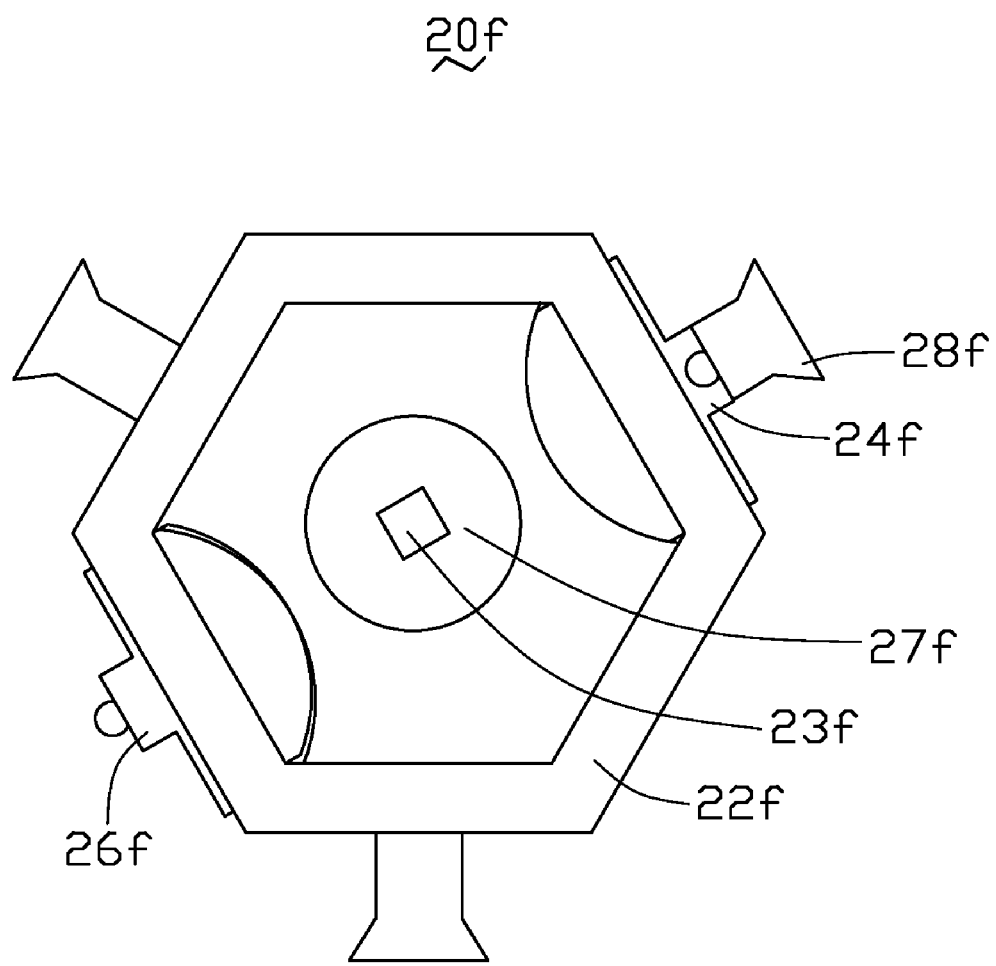
FIG. 20 is a top view of an LED in accordance with a seventh embodiment of the present invention.
Figure 21:
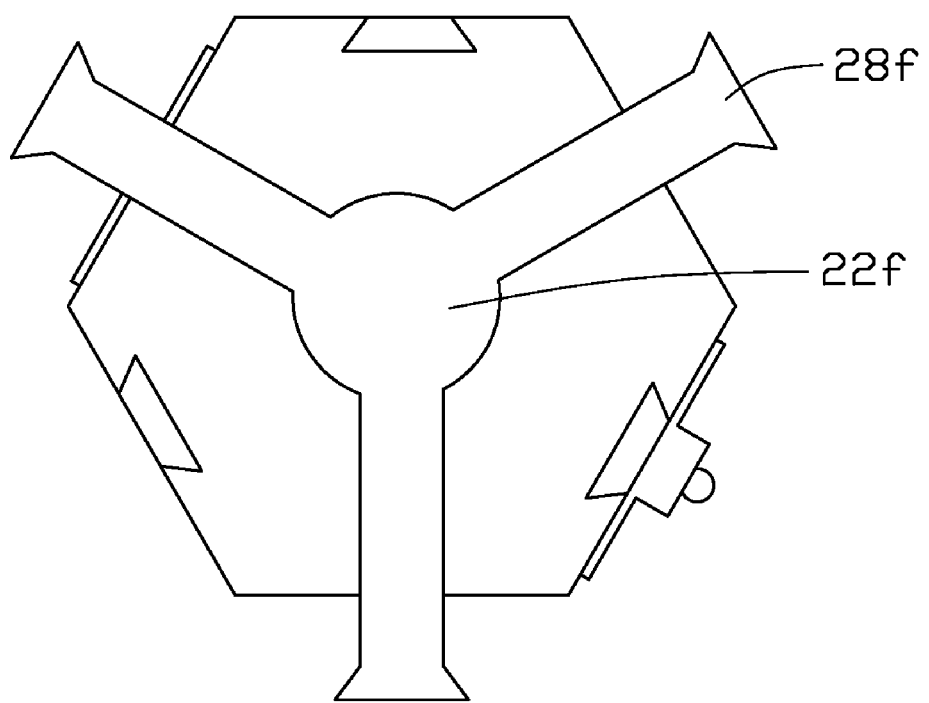
FIG. 21 is a bottom view of FIG. 20.

Furthermore, the base 22 of the first embodiment can be modified to another structure which is shown in FIGS. 20-21 in accordance with a seventh embodiment of the present invention. The differences of the seventh embodiment relative to the first embodiment are given below.

The base 22f of the LED 20f of the seventh embodiment is made of a thermally isolating and electrically insulating material such as epoxy, plastic and so on. A through hole (not labeled) is defined in a center of the base 22f of the LED 20f. Three channels (not labeled) are radially formed in a bottom of the base 22f, communicating with the through hole. A metal structure (not labeled), which is integrally formed by a post 27f and three legs 28f, is filled in the through hole and the three channels, and separated from the first lead 24f and the second lead 26f by the base 22f. Each leg 28f has an interior portion (not labeled) retained in a corresponding channel and coupling with a circumferential periphery of the post 27f, and an exterior portion (not labeled) extending outside the base 22f for locking with an adjacent LED 20f. The post 27f, the legs 28f and the base 22f contact the substrate 10 by bottoms thereof engaging with the top surface of the substrate 10. An LED die 23f is fixed on a top of the post 27f via a thermally conducting grease or glue. By using this construction, nearly all of heat generated by the LED die 23f is conducted to the substrate 10 via the post 27f and the legs 28f, while a current given to the LED die 23f is conveyed through a first and second leads 24f, 26f which are spaced from the post 27f and the legs 28f by the base 22f; thus, a current conducting pathway of the LED assembly and a heat conducting pathway thereof are substantially separated from each other, and the current can be maintained in a steady state without being affected by the heat. Note that all of other components in this embodiment are the same as those described in the first embodiment.

Figure 22:
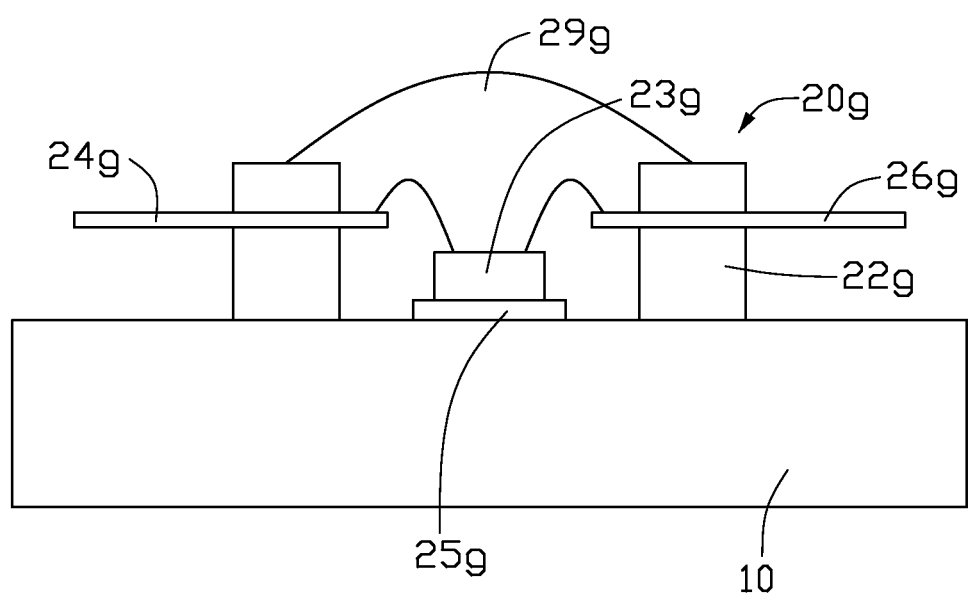
FIG. 22 is a cross-sectional view of an LED assembly in accordance with an eighth embodiment of the present invention.
Figure 23:
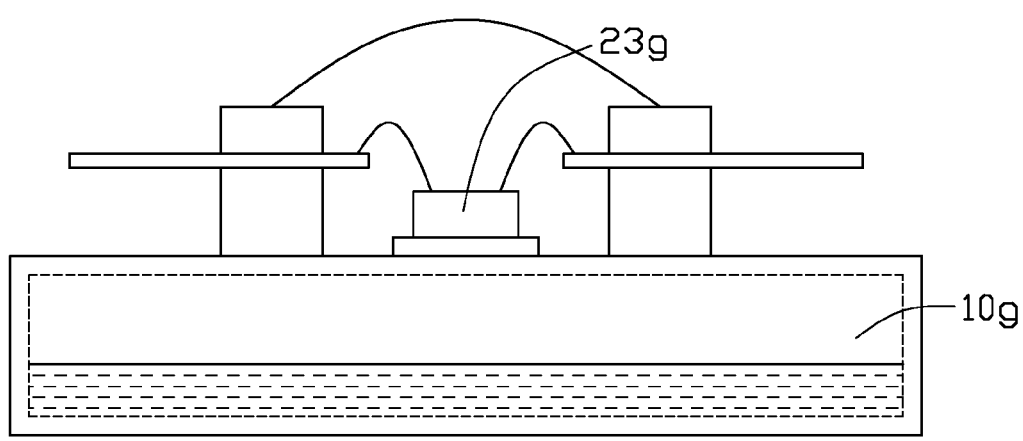
FIG. 23 is a view similar to FIG. 22, wherein a substrate of the LED assembly contains a coolant therein.

Referring to FIG. 22, which shows an LED assembly in accordance with an eighth embodiment of the present invention. In order to conduct heat generated by an LED die 23g to the substrate 10 more rapidly, a portion of a base 22g placed between the LED die 23g and the substrate 10 is omitted, while the LED die 23 is directly bonded on the top face of the substrate 10 via a kind of heat conducting adhesive 25g. Preferably, a thickness of the heat conducting adhesive 25g is selected to be less than 0.01 inches, for obtaining a balance between a good heat conducting capability and a sufficient gluing force. The base 22g of each LED 20g is annular to spacedly surround the LED die 23g. A first lead 24g and a second lead 26g are respectively inserted into the base 22g with inner parts (not labeled) thereof being exposed and outer parts (not labeled) thereof hovering above the substrate 10. The LED die 23g is electrically connected to the first and second leads 24g, 26g via golden wires (not labeled). An encapsulant 29g envelops the LED die 23g and the inner parts of the first and second leads 24g, 26g therein to protect the LED die 23g from contamination and damage. Referring to FIG. 23, for more efficiently deriving heat from the LED die 23g, such solid metal substrate 10 can be replaced by a hollow substrate 10g which transfers heat by using a phase change of working fluid. The substrate 10g can be a flat vapor chamber or a heat pipe. The substrate 10g can further connect with a heat sink (not shown) to disperse heat absorbed thereby to atmosphere, whereby the heat can be dissipated timely and sufficiently because of a large heat dissipating area of the heat sink.

Figure 24:
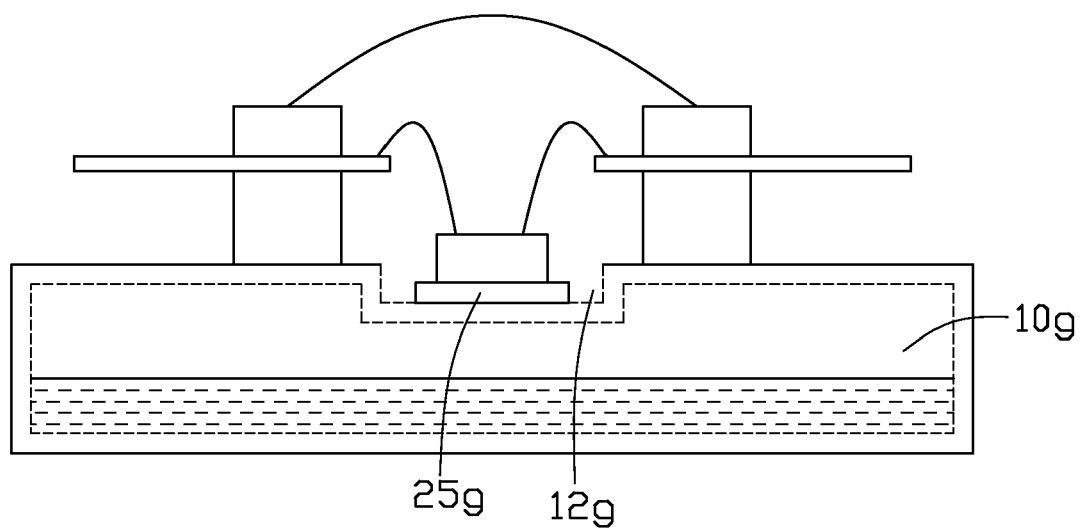
FIG. 24 is a view similar to FIG. 23 with a part of the substrate stamped to form a concave.

As viewed from FIG. 24, furthermore, the substrate 10g can be stamped to form a plurality of concaves 12g (only one shown) at spots where the LED dies 23g are mounted, whereby the LED dies 23g can be accurately positioned at predetermined locations of the substrate 10g. On the other hand, such concave 12g is able to contain the adhesive 25g therein for preventing the adhesive 25g from overflowing to other parts of the substrate 10g.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED assembly comprising:
   a plurality of LEDs, each comprising:
      a first electrode lead; and
      a second electrode lead, the first electrode lead of each of the LEDs being soldered with the second electrode lead of an adjacent one of the LEDs, wherein an accommodating space is formed in the connected first electrode lead above the connected second electrode lead, the accommodating space being adapted for receiving excess solder when soldering the connected first electrode lead and the connected second electrode lead together;
   wherein the connected first electrode lead defines a groove at an extremity end thereof, and the connected second electrode lead forms a tab projecting from a distal end thereof, the tab fitting into the groove.

2. The LED assembly as claimed in claim 1, wherein a thickness of the tab is less than a depth of the groove, an inner circumference of the connected first electrode lead defining the groove and a top surface of the tab of the connected second electrode lead cooperatively forming the accommodating space.

3. The LED assembly as claimed in claim 1 further comprising a substrate mounted below the plurality of LEDs, wherein the connected first electrode lead and the connected second electrode lead are substantially parallel to the substrate.

4. The LED assembly as claimed in claim 1, wherein the each of the plurality of LEDs further comprises a base, the first electrode lead and the second electrode lead of the each LED being inserted into two opposite sides of the base, respectively.

5. The LED assembly as claimed in claim 4, wherein each of the first electrode lead and the second electrode lead of the each LED comprises a sheet secured in the base and a block extending outwardly from the base.

6. The LED assembly as claimed in claim 5, wherein the sheet has an inwardly curved, arc-shaped inner part located within the base, and a rectangular outer part slightly projecting from the base to couple with the block.

7. The LED assembly as claimed in claim 5, wherein a geometry of the block is smaller than that of the sheet.

8. The LED assembly as claimed in claim 5, wherein the groove is defined in the block of the first electrode lead, and the tab is formed from the block of the second electrode lead.

9. The LED assembly as claimed in claim 1, wherein each of the groove and the tab has a shape similar to a circle.

10. An LED assembly comprising:
  a plurality of LEDs, each comprising:
    a body; and
    a first lead and a second lead extending through the body, the first lead of each of the LEDs being soldered with the second lead of an adjacent one of the LEDs, wherein a part of the first lead which is used for soldering with the second lead forms a void therein to receive excess solder;
  wherein the void is defined at a location where the first lead and the second lead of two adjacent LEDs are connected with each other; and
  wherein the first lead forms a groove in an extremity end thereof, a free end of the second lead being accommodated in the groove to define the void together with the first lead.

11. The LED assembly as claimed in claim 10, wherein each of the first lead and the second lead has a wide portion inserted into the body and a narrow portion projecting from the body, the groove being defined at the narrow portion of the first lead.

12. The LED assembly as claimed in claim 10 further comprising a substrate supporting the plurality of LEDs thereon, wherein the first lead and the second lead are parallel to the substrate.

\* \* \* \* \*